US008570061B2

(12) United States Patent
Golke

(10) Patent No.: US 8,570,061 B2
(45) Date of Patent: Oct. 29, 2013

(54) (N-1)-OUT-OF-N VOTER MUX WITH ENHANCED DRIVE

(75) Inventor: Keith Golke, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 50 days.

(21) Appl. No.: 13/176,405

(22) Filed: Jul. 5, 2011

(65) Prior Publication Data
US 2013/0009664 A1    Jan. 10, 2013

(51) Int. Cl.
H03K 19/003    (2006.01)
(52) U.S. Cl.
USPC .............................. 326/11; 326/13; 714/797
(58) Field of Classification Search
USPC ........................................ 326/9–13; 714/797
See application file for complete search history.

(56) References Cited

U.S. PATENT DOCUMENTS

| 3,900,742 | A | | 8/1975 | Hampel et al. |
| 4,038,564 | A | * | 7/1977 | Hakata ............................ 326/60 |
| 4,091,293 | A | * | 5/1978 | Ando ............................... 326/36 |
| 4,621,201 | A | | 11/1986 | Amdahl et al. |
| 6,906,388 | B2 | * | 6/2005 | Fulkerson ...................... 257/369 |
| 2002/0074609 | A1 | | 6/2002 | Maruyama |
| 2002/0075907 | A1 | * | 6/2002 | Cangiani et al. .............. 370/535 |
| 2004/0099913 | A1 | * | 5/2004 | Fulkerson ...................... 257/369 |
| 2004/0227551 | A1 | | 11/2004 | Gardner |
| 2011/0241724 | A1 | * | 10/2011 | Arima ............................. 326/11 |

FOREIGN PATENT DOCUMENTS

WO    2004049572 A1    6/2004

OTHER PUBLICATIONS

Beiu et al., "The Vanishing Majority Gate Trading Power and Speed for Reliability," May 1, 2005, 8 pages.
Beiu et al., "In Praise of Serial Addition (Locally Connected Architectures)," IEEE-T-CAS-I (4923=4212 Revised): Special Issue on Nanoelectronic Circuits and Nanoarchitectures, 2007, 17 pages.

\* cited by examiner

*Primary Examiner* — Jany Richardson
(74) *Attorney, Agent, or Firm* — Shumaker & Sieffert, P.A.

(57) ABSTRACT

This disclosure describes voting circuits where an output is generated based on a plurality of inputs. A first plurality of logic paths connects the output to a high voltage. Each logic path of the first plurality of logic paths includes two transistors. A second plurality of logic paths connects the output to the low voltage. Each logic path of the second plurality of logic paths comprises two transistors. Based on N or N-1 of the inputs agreeing, the output is driven to either the low voltage or the high voltage via a subset of logic paths of the first and second plurality of logic paths.

15 Claims, 8 Drawing Sheets

US 8,570,061 B2

(N-1)-OUT-OF-N VOTER MUX WITH ENHANCED DRIVE

TECHNICAL FIELD

This disclosure relates to electronics that utilize redundant data paths and redundant clock paths.

BACKGROUND

Modern electronics typically consist of a collection of functional units such as gates, registers, flip flops, and arithmetic logic units. Data travels through the collection of functional units along a data path. The functional units are synchronized to a clock signal that travels through the collection of functional units on a clock path.

Radiation hardening is a method of designing electronic devices to make them resistant to malfunctions caused by ionizing radiation such as particle radiation and high-energy electromagnetic radiation. Ionizing radiation can cause what are known as single-event effects (SEEs), where charge might accumulate on a node of a circuit causing an incorrect state change, a short, or other such undesirable effect. One specific type of SEE is commonly referred to as a single-event transient (SET), which occurs when charge from ionization collects on a specific node of a circuit causing a temporary voltage change on the node. Ionizing radiation is present on the surface of the earth, in the presence of nuclear reactions for example, but becomes more prevalent at higher altitudes where planes fly, and becomes even more prevalent in outer space where satellites orbit.

One method of radiation hardening to an SET utilizes redundant data paths and/or redundant clock paths within a circuit, and implements voting circuits to discard disagreeing data. In the instances where not all data paths agree, however, the output drive of the voting circuit can be reduced. Additionally, sometimes ionizing radiation on an internal node of the voting circuit can cause the voting circuit itself to be adversely affected by the same type of SETs it is meant to protect against.

SUMMARY

In general, this disclosure describes voting circuits, such as 2-out-of-3 voting circuits and 3-out-of-4 voting circuits, that utilize redundant data paths. In some instances, the voting circuits described in this disclosure may provide improved disturbed drive strength as well as reduce the occurrence of the SETs.

In one example, a circuit includes a plurality of inputs; an output; a high voltage source; a low voltage source; a first plurality of logic paths connecting the output to the high voltage, wherein each logic path of the first plurality of logic paths comprises two transistors; and, a second plurality of logic paths connecting the output to the low voltage, wherein each logic path of the second plurality of logic paths comprises two transistors.

In another example, this disclosure describes a 2-out-of-3 voting circuit that includes a first input; a second input; a third input; a high voltage source; a low voltage source; a first p-channel metal-oxide silicon field-effect transistor (MOSFET), wherein a source of the first p-channel MOSFET is connected to the high voltage source and a gate of the first p-channel MOSFET is connected to the first input; a second p-channel MOSFET, wherein a source of the second p-channel MOSFET is connected to the high voltage source and a gate of the second p-channel MOSFET is connected to the third input; a third p-channel MOSFET, wherein a source of the third p-channel MOSFET is connected to the high voltage source and a gate of the third p-channel MOSFET is connected to the second input; a fourth p-channel MOSFET, wherein a source of the fourth p-channel MOSFET is connected to the high voltage source and a gate of the fourth p-channel MOSFET is connected to the first input; a fifth p-channel MOSFET, wherein a source of the fifth p-channel MOSFET is connected to the high voltage source and a gate of the fifth p-channel MOSFET is connected to the third input; a sixth p-channel MOSFET, wherein a source of the sixth p-channel MOSFET is connected to the high voltage source and a gate of the sixth p-channel MOSFET is connected to the second input; a first n-channel MOSFET, wherein a source of the first n-channel MOSFET is connected to the low voltage source and a gate of the first n-channel MOSFET is connected to the first input; a second n-channel MOSFET, wherein a source of the second n-channel MOSFET is connected to the low voltage source and a gate of the second n-channel MOSFET is connected to the third input; a third n-channel MOSFET, wherein a source of the third n-channel MOSFET is connected to the low voltage source and a gate of the third n-channel MOSFET is connected to the second input; a fourth n-channel MOSFET, wherein a source of the fourth n-channel MOSFET is connected to the low voltage source and a gate of the fourth n-channel MOSFET is connected to the first input; a fifth n-channel MOSFET, wherein a source of the fifth n-channel MOSFET is connected to the low voltage source and a gate of the fifth n-channel MOSFET is connected to the third input; a sixth n-channel MOSFET, wherein a source of the sixth n-channel MOSFET is connected to the low voltage source and a gate of the sixth n-channel MOSFET is connected to the second input; a seventh p-channel MOSFET, wherein a source of the seventh p-channel MOSFET is connected to a drain of the first p-channel MOSFET and a drain of the second p-channel MOSFET and a gate of the seventh p-channel MOSFET is connected to the second input; an eighth p-channel MOSFET, wherein a source of the eighth p-channel MOSFET is connected to a drain of the third p-channel MOSFET and a drain of the fourth p-channel MOSFET, and a gate of the eighth p-channel MOSFET is connected to the third input; a ninth p-channel MOSFET, wherein a source of the ninth p-channel MOSFET is connected to a drain of the fifth p-channel MOSFET and a drain of the sixth p-channel MOSFET, and a gate of the ninth p-channel MOSFET is connected to the first input; a seventh n-channel MOSFET, wherein a source of the seventh n-channel MOSFET is connected to a drain of the first n-channel MOSFET and a drain of the second n-channel MOSFET, a drain of the seventh n-channel MOSFET is connected to a drain of the seventh p-channel MOSFET, and a gate of the seventh n-channel MOSFET is connected to the second input; an eighth n-channel MOSFET, wherein a source of the eighth n-channel MOSFET is connected to a drain of the third n-channel MOSFET and a drain of the fourth n-channel MOSFET, a drain of the eighth n-channel MOSFET is connected to a drain of the eighth p-channel MOSFET, and a gate of the eighth n-channel MOSFET is connected to the third input; a ninth n-channel MOSFET, wherein a source of the ninth n-channel MOSFET is connected to a drain of the fifth n-channel MOSFET and a drain of the sixth n-channel MOSFET, a drain of the ninth n-channel MOSFET is connected to a drain of the ninth p-channel MOSFET, and a gate of the ninth n-channel MOSFET is connected to the first input; an output, wherein the output is connected to the drain of the seventh n-channel MOSFET, the drain of the eighth n-channel MOSFET, the drain of the ninth n-channel MOS- FET, the drain of the seventh p-channel MOSFET, the drain of the eighth p-channel MOSFET, and the drain of the ninth p-channel MOSFET.

In another example, a 3-out-of-4 voting circuit includes a first input; a second input; a third input; a fourth input; a high voltage source; a low voltage source; a first p-channel metal-oxide silicon field-effect transistor (MOSFET), wherein a source of the first p-channel MOSFET is connected to the high voltage source and a gate of the first p-channel MOSFET is connected to the first input; a second p-channel MOSFET, wherein a source of the second p-channel MOSFET is connected to the high voltage source and a gate of the second p-channel MOSFET is connected to the second input; a third p-channel MOSFET, wherein a source of the third p-channel MOSFET is connected to a drain of the first p-channel MOSFET and a drain of the second p-channel MOSFET, and a gate of the third p-channel MOSFET is connected to the third input; a fourth p-channel MOSFET, wherein a source of the fourth p-channel MOSFET is connected to a drain of the first p-channel MOSFET and a drain of the second p-channel MOSFET, and a gate of the fourth p-channel MOSFET is connected to the fourth input; a first n-channel MOSFET, wherein a source of the first n-channel MOSFET is connected to the low voltage source and a gate of the first n-channel MOSFET is connected to the first input; a second n-channel MOSFET, wherein a source of the second n-channel MOSFET is connected to the low voltage source and a gate of the second n-channel MOSFET is connected to the second input; a third n-channel MOSFET, wherein a source of the third n-channel MOSFET is connected to a drain of the first n-channel MOSFET and a drain of the second n-channel MOSFET, and a gate of the third n-channel MOSFET is connected to the third input; a fourth n-channel MOSFET, wherein a source of the fourth n-channel MOSFET is connected to a drain of the first n-channel MOSFET and a drain of the second n-channel MOSFET, and a gate of the fourth n-channel MOSFET is connected to the fourth input; and, an output, wherein the output is connected to a drain of the third n-channel MOSFET, a drain of the fourth n-channel MOSFET, a drain of the third p-channel MOSFET, a drain of the fourth p-channel MOSFET.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
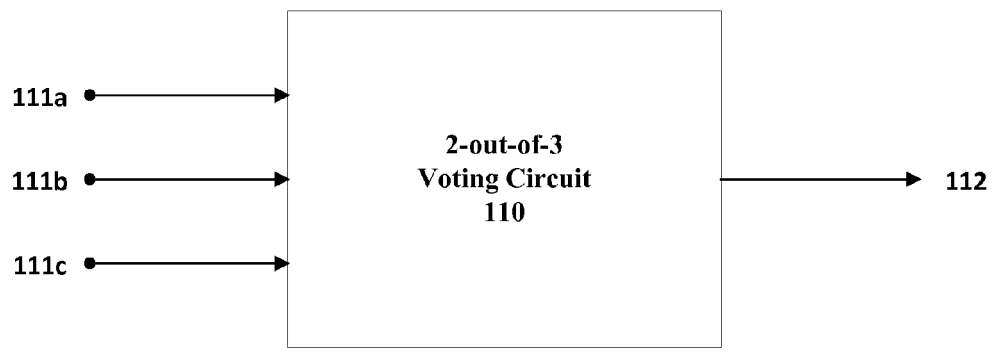
FIGS. 1A and 1B show block diagrams of voting circuits configured according to the techniques described in this disclosure.
Figure 1B:
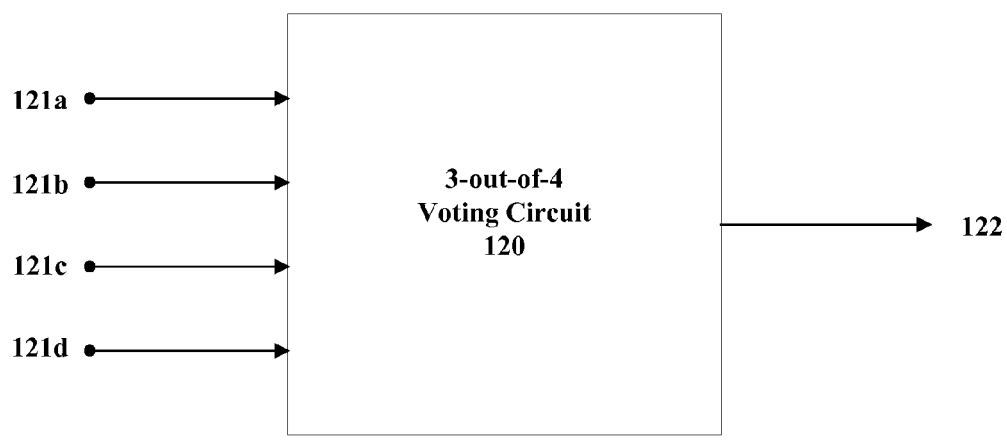

FIGS. 1A and 1B are block diagrams of voting circuits configured according to the techniques described in this disclosure. The voting circuits of FIGS. 1A and 1B can be implemented in the clock paths or data paths of electronic devices that utilize redundant circuitry. As will be described in more detail below, the voting circuits of FIGS. 1A and 1B can include a plurality of transistors, such as p-channel metal-oxide semiconductor field-effect transistors (MOSFETs) and n-channel MOSFETs. The techniques described in this disclosure are generally applicable to (N−1)-out-of-N voting circuits, and thus can be used to create voting circuits with more inputs than those shown in FIGS. 1A and 1B. The output state of an (N−1)-out-of-N voting circuit corresponds to the state of the N−1 inputs that agree. Thus, one input can be in error and the output will correspond to the other N−1 inputs which have the correct state. Voting circuits with more than one logic level between the inputs and the output can be vulnerable to corruption of the output from SETs occurring on the nodes between logic elements, as will be described in relation to FIG. 2. Voting circuits with one logic level between the inputs and output do not have these SET vulnerable nodes. Voting circuits with an odd number of logic levels between the inputs and output typically invert the state from input to output, while voting circuits with an even number of logic levels typically do not invert the state from input to output.

FIG. 1A illustrates a 2-out-of-3 of voting circuit 110 which receives three inputs 111a-c and produces an output 112 based on the three inputs 111a-c. Assuming the voting circuit of FIG. 1A inverts the input state, if all three inputs 111a-c are high, then output 112 will be low. If all three inputs 111a-c are low, then output 112 will be high. If 2-out-of-3 of inputs 111a-c are high, then output 112 will be low, and if 2-out-of-3 of inputs 111a-c are low, then output 112 will be high.

FIG. 1B illustrates a 3-out-of-4 of voting circuit 120 which receives four inputs 121a-d and produces an output 122 based on the four inputs 121a-d. Assuming the voting circuit of FIG. 1B inverts the input state, if all four inputs 121a-d are high, then output 122 will be low. If all four inputs 121a-d are low, then output 122 will be high. If 3-out-of-4 of inputs 121a-d are high, then output 122 will be low, and if 3-out-of-4 of inputs 121a-d are low, then output 122 will be high.

Figure 2:
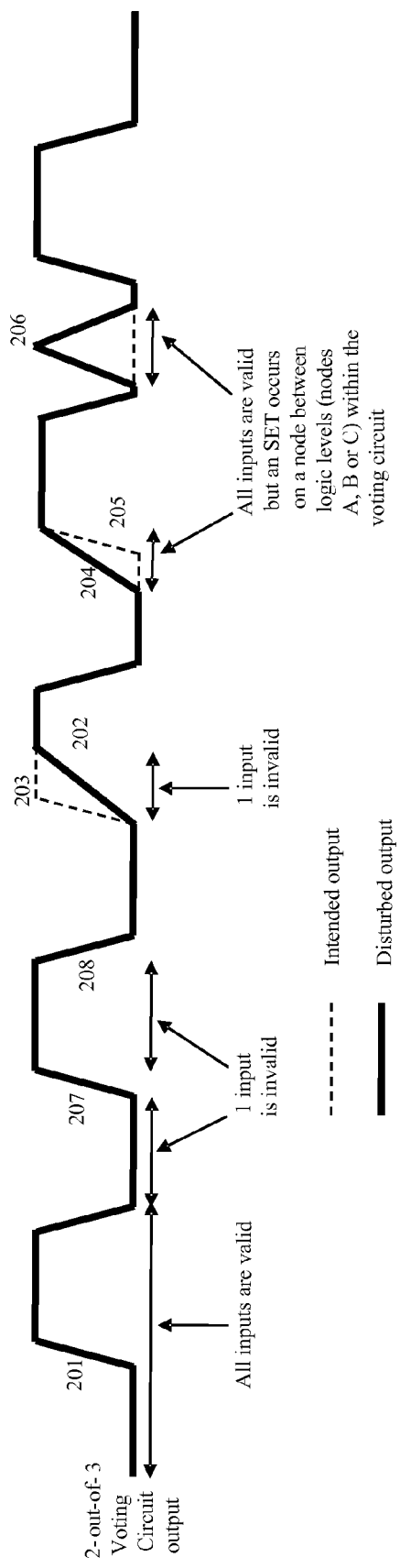
FIG. 2 is an illustration of an output of a voting circuit.

FIG. 2 is an illustration of an output of a prior art voting circuit. For purposes of explanation it will be assumed that the signal in FIG. 2 is a clock signal, but the signal could also be a data signal. Signal portion 201 shows a rising clock edge for the output of a voting circuit when all inputs agree and there is no SET disturbance within the voting circuit. In an ideal system, the signal would move from low to high instantaneously, but in real-world circuits, electronic components take a finite amount of time to transition from a low state to a high state. The amount of time needed to transition from low to high, as indicated by the slope or signal portion 201 shown in FIG. 2 is exaggerated for ease of explanation. This transition time is typically a function of the size (i.e., drive strength) of the devices driving the output. Signal portions 207 and 208 show the voting circuit rejecting a disturbance on one of the inputs when the other inputs are stable. Signal portion 202 shows a rising clock edge for the output of a voting circuit when less than all inputs of the voting circuit agree while transitioning from low to high. As can be seen by comparing signal portion 202 to the case where a disturbance did not occur (represented by dotted line 203), the amount of time needed for the signal to transition from a low state to a high state increases when fewer than all inputs agree. This increase in transition time is caused by a decrease in the drive strength of the voting circuit as a result of only 2-out-of-3 inputs agreeing. The reduced drive strength caused by fewer than all inputs of a voting circuit agreeing will henceforth be referred to as the disturbed drive strength of the voting circuit and the ratio of the disturbed drive strength to the non-disturbed full drive strength (i.e. the drive strength when all inputs agree) will henceforth be referred to as the disturbed drive strength ratio. The displacement of a signal edge from its non-disturbed (i.e., ideal) location is sometimes referred to as jitter.

Signal portion 204 shows a rising clock edge corresponding to an SET on a node between logic levels within the voting circuit with all inputs of a voting circuit agreeing. As can be seen by comparing signal portion 204 to the case where the disturbance did not occur (represented by dotted line 205), the rising clock edge is premature. As shown by signal portion 206, an SET on an internal node of the voting circuit can cause an extra pulse, which can propagate through the system as an incorrect clock pulse.

The voting circuits described in this disclosure, such as voting circuits 110 and 120 of FIGS. 1A and 1B, may offer improved disturbed drive output relative to conventional circuits, thus reducing the transition time from a high state to a low state in instances where not all inputs of a voting circuit agree. In a voting circuit implementing techniques of this disclosure, for example, the slope of signal portion 202 may be somewhat closer to the slope of signal portion 201 than for conventional current voting circuits. Additionally, the voting circuits described in this disclosure can be assembled with one logic level and thus fewer internal nodes relative to conventional circuits, thus reducing the occurrences of SETs such as those represented by signal portions 204 and 206.

Figure 3:
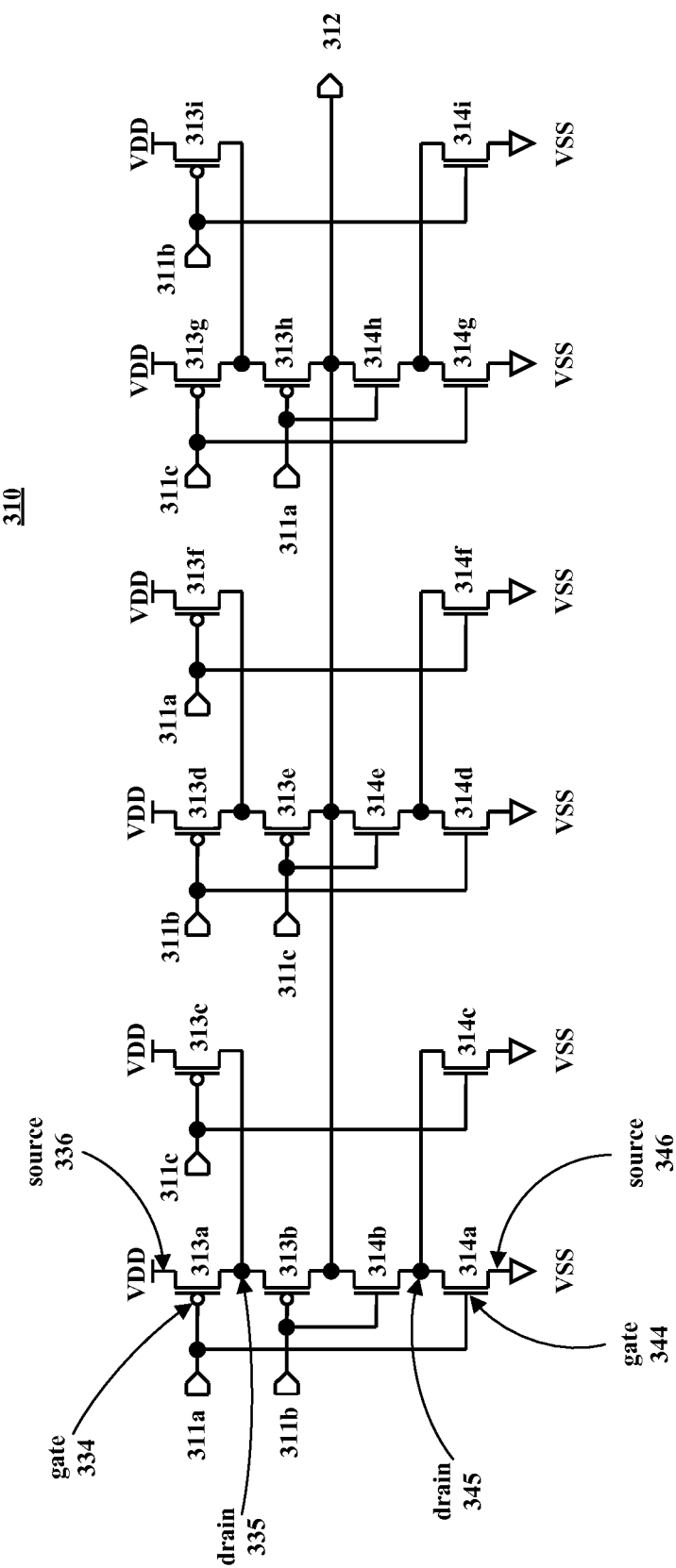
FIG. 3 shows a circuit diagram for a 2-out-of-3 voting circuit according to techniques of this disclosure.

FIG. 3 shows a circuit diagram for a 2-out-of-3 voting circuit 310 such as voting circuit 110 of FIG. 1A. Voting circuit 310 receives three inputs 311a-c and produces an output 312 in the same manner as described above in relation to FIG. 1A. Voting circuit 310 includes a plurality of p-channel MOSFETs 313a-313i and a plurality of n-channel MOSFETs 314a-i arranged in the configuration shown in FIG. 3. Sources of p-channel MOSFETs 313a 313c, 313d, 313f, 313g, and 313i are connected to high voltage $V_{DD}$. Drains of p-channel MOSFETs 313a and 313c are connected to the source of p-channel MOSFET 313b, drains of p-channel MOSFETs 313d and 313f are connected to the source of p-channel MOSFET 313e, and drains of p-channel MOSFETs 313g and 313i are connected to the source of p-channel MOSFET 313h. Sources of n-channel MOSFETs 314a, 314c, 314d, 314f, 314g, and 314i are connected to a low voltage $V_{SS}$. Drains of n-channel MOSFETs 314a and 314c are connected to the source of n-channel MOSFET 314b, drains of n-channel MOSFETs 314d and 314f are connected to the source of n-channel MOSFET 314e, and drains of n-channel MOSFETs 314g and 314i are connected to the source of n-channel MOSFET 314h. Drains of p-channel MOSFETs 313b, 313e, and 313h are connected to drains of n-channel MOSFETs 314b, 314e, and 314h and all these drains are connected to output 312. Although the present disclosure generally describes voting circuits implemented using CMOS logic, other types of logic such as TTL, NMOS, ECL, and other logic families may also be used.

As shown in FIG. 3, p-channel MOSFET 313a includes a gate 334, a drain 335, and a source 336. Although not explicitly labeled on FIG. 3, p-channel MOSFETs 313b-313i similarly include gates, drains, and sources as described in relation to p-channel MOSFET 313a. As will be described in more detail below, p-channel MOSFETs 313a-313i do not necessarily all have the same parameters, but all of p-channel MOSFETs 313a-313i generally operate according to the same principles, which will be described in relation to p-channel MOSFET 313a.

P-channel MOSFET 313a is configured to operate as a switch that enables current flow from source 336 to drain 335 when the switch is "on" but inhibits current flow from source 336 to drain 335 when the switch is "off." When the switch is "off" it is possible that a very small amount of current will still flow from the source of the MOSFET to the drain of the MOSFET, but this very small amount of current is not significant enough to alter the functionality of the circuit as described. For purposes of explanation, this disclosure will assume no current flows through a MOSFET when the MOSFET is "off." When the voltage between gate 334 and source 336 is greater than a threshold voltage, then p-channel MOSFET 313a is "on," and when the voltage between gate 334 and source 336 is less than a threshold voltage, then p-channel MOSFET 313a is "off." Thus, whether p-channel MOSFET 313a is "on" or "off" depends on the voltage applied to gate 334, which depends on input 311a. When input 311a is high, then the voltage difference between source 336 and gate 334 is low, causing p-channel MOSFET 313a to be "off." When input 311a is low, then the voltage difference between source 336 and gate 334 is high, causing p-channel MOSFET 331a to be "on."

P-channel MOSFETS 313b-313i are configured to operate in a similar to manner as described in relation to p-channel MOSFETT 313a. In response to high inputs at their gates, p-channel MOSFETs 313b-313i are "off" and in response to a low inputs at their gates, p-channel MOSFETs 313b-313i are "on."

N-channel MOSFET 314a includes a gate 344, a drain 345, and a source 346. Although not explicitly labeled on FIG. 3, n-channel MOSFETs 314b-314i similarly include gates, drains, and sources as described in relation to n-channel MOSFET 314a. As will be described in more detail below, n-channel MOSFETs 314a-314i do not all necessarily have the same parameters, such as gate width and gate length, but all of n-channel MOSFETs 314a-314i generally operate according to the same principles, which will be described in relation to n-channel MOSFET 314a.

N-channel MOSFET 314a is configured to operate as a switch that enables current flow from drain 345 to source 346 when the switch is "on" but blocks current flow from drain 345 to source 346 when the switch is "off." When the voltage between gate 344 and source 346 is greater than a threshold voltage, then n-channel MOSFET 314a is "on," and when the voltage between gate 344 and source 346 is less than a threshold voltage, then n-channel MOSFET 314a is "off." Thus, whether n-channel MOSFET 314a is "on" or "off" depends on the voltage applied to gate 344, which depends on input 311a. When input 311a is low, then the voltage difference between source 346 and gate 344 is low, causing n-channel MOSFET 314a to be "off." When input 311a is high, then the voltage difference between source 346 and gate 344 is high, causing n-channel MOSFET 341a to be "on."

N-channel MOSFETS 314b-314i are configured to operate in a similar to manner as described in relation to n-channel MOSFETT 314a. In response to low inputs at their gates, n-channel MOSFETs 314b-314i are "off" and in response to high inputs at their gates, n-channel MOSFETs 314b-314i are "on."

The operation of voting circuit 310 will be now described in reference to several examples. There are six paths by which output 312 can connect to voltage $V_{DD}$ and six paths by which output 312 can connect to voltage $V_{SS}$. Each path travels through two MOSFETs. For example, the six paths from $V_{DD}$ to output 312 are the 313a-313b path, the 313c-313b path, the 313d-313e path, the 313f-313e path, the 313g-313h path, and the 313i-313h path. The six paths from $V_{SS}$ to output 312 are the 314a-314b path, the 314c-314b path, the 314d-314e path, the 314f-314e path, the 314g-314h path, and the 314i-314h path. Output 312 is only connected to $V_{DD}$ or $V_{SS}$ by a particular path if both MOSFETs in the path are "on."

In a first example, all of inputs 311a-311c are high. If all of inputs 311a-311a are high, then all of p-channel MOSFETs 313a-313i are "off," and all of n-channel MOSFETs 314a-314i are "on." If all of p-channel MOSFETs are "off" and all of n-channel MOSFETs 314a-i are "on," then output 312 is not connected to high voltage $V_{DD}$ through any available current path and is connected to low voltage $V_{SS}$ through all available current paths. In such a scenario, output 312 will be driven to the low voltage $V_{SS}$.

In a second example, all of inputs 311a-311c are low. If all of inputs 311a-311c are low, then all of p-channel MOSFETs 313a-313i are "on," and all of n-channel MOSFETs 314a-314i are "off." If all of p-channel MOSFETs are "on" and all of n-channel MOSFETs 314a-314i are "off," then output 312 is connected to high voltage $V_{DD}$ through all available current paths and is not connected to low voltage $V_{SS}$ through any available current paths. In such a scenario, output 312 will be driven to the high voltage $V_{DD}$.

In a third example, inputs 311a and 311b are high while input 311c is low. If inputs 311a and 311b are high, then p-channel MOSFETs 313a, 313b, 313d, 313f, 313h, and 313i are "off" while n-channel MOSFETs 314a, 314b, 314d, 314f, 314h, and 343i are "on." If input 311c is low, then p-channel MOSFETs 313c, 313e, and 313g are "on" while n-channel MOSFETs 314c, 314e, and 314g are "off." Thus, output 312 is not connected to $V_{DD}$ through any path because none of the six paths connecting $V_{DD}$ to output 312 have both MOSFETs "on." Output 312, however, is connected to $V_{SS}$ through two paths (314a-314b and 314i-314h), which drives output 312 low to $V_{SS}$.

In a fourth example, inputs 311a and 311b are low while input 311c is high. If inputs 311a and 311b are low, then p-channel MOSFETs 313a, 313b, 313d, 313f, 313h, and 313i are "on" while n-channel MOSFETs 314a, 314b, 314d, 314f, 314h, and 314i are "off." If input 311c is high, then p-channel MOSFETs 313c, 313e, and 313g are "off" while n-channel MOSFETs 314c, 314e, and 314g are "on." Thus, output 312 is not connected to $V_{SS}$ through any path because none of the six paths connecting $V_{SS}$ to output 312 have both MOSFETs "on." Output 312, however, is connected to $V_{DD}$ through two paths (313a-313b and 313i-313h), which drives output 312 high to $V_{DD}$.

Other examples, such as inputs 311a and 311c being high while input 311b is low or inputs 311a and 311c being low while input 311b cause voting circuit 310 to behave in an analogous manner to the third and fourth examples provided above, although the particular paths connecting output 312 to $V_{DD}$ and $V_{SS}$ may differ.

The disturbed drive strength of the voting circuit of FIG. 3 can be affected by the selection of p-channel MOSFET sizes and n-channel MOSFET sizes. For example, if the gate widths of all of p-channel MOSFETs 313a-313i are relatively equal to one another, and the gate widths of n-channel MOSFETs 314a-314i are relatively equal to one another, then the disturbed drive (i.e. the drive when only 2-out-of-3 inputs agree) may be about fifty percent of the full drive (i.e. the drive when all inputs agree). If, however, p-channel MOSFETs are selected such that the gate widths of p-channel MOSFETs 313a, 313c, 313d, 313f, 313g, and 313i are about twice the gate width of p-channel MOSFETs 313b, 313e, and 313h, and the gate widths of n-channel MOSFETs 314a, 314c, 314d, 314f, 314g, and 314i are about twice the gate widths of n-channel MOSFETs 314b, 314e, and 314h, then the disturbed drive strength may improve to about fifty-six percent of the full drive strength. If p-channel MOSFETs are selected such that the gate widths of p-channel MOSFETs 313a, 313c, 313d, 313f, 313g, and 313i are much much greater than the gate width of p-channel MOSFETs 313b, 313e, and 313h, and the gate widths of n-channel MOSFETs 314a, 314c, 314d, 314f, 314g, and 314i are much much greater than the gate widths of n-channel MOSFETs 314b, 314e, and 314h, then the disturbed drive strength may begin to approach sixty-six percent of the full drive strength. The optimum MOSFET size may depend on the needs and constraints of a particular application. These needs and constraints could include such factors as area, input capacitance, and the amount of disturbed drive strength that can be tolerated (i.e., jitter). Thus, when implementing the techniques of this disclosure, there is not necessarily a single optimum gate width for all configurations. In general, however, the two-to-one ratio described above that results in a disturbed drive strength of about fifty-six percent may generally be a reasonable trade-off to fit the needs and constraints of most applications.

Figure 4:
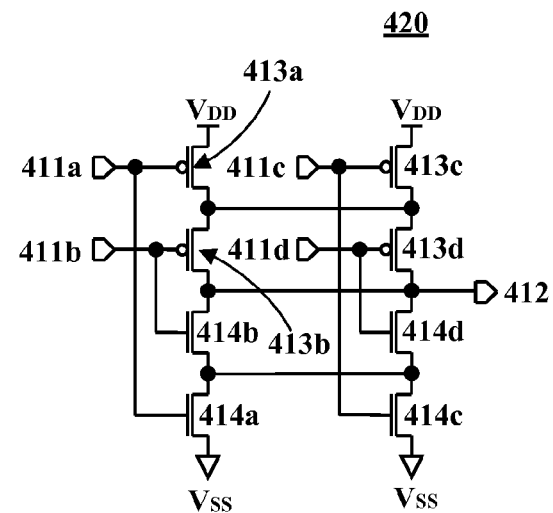
FIG. 4 shows a circuit diagram for a 3-out-of-4 voting circuit according to techniques of this disclosure.

FIG. 4 shows a circuit diagram for a 3-out-of-4 voting circuit 420, which operates in the same manner as voting circuit 120 of FIG. 1B. Voting circuit 420 receives four inputs 411a-411d and produces an output 412 in the same manner as described above in relation to FIG. 1B. Voting circuit 420 includes a plurality of p-channel MOSFETs 413a-413d and a plurality of n-channel MOSFETs 414a-414d arranged in the configuration shown in FIG. 4. Sources of p-channel MOSFETs 413a and 413c are connected to high voltage $V_{DD}$. Sources of n-channel MOSFETs 414a and 414c are connected to a low voltage $V_{SS}$. Drains of both p-channel MOSFETs 413a and 413c are connected to the sources of both p-channel MOSFETs 413b and 413d. Drains of both n-channel MOSFETs 414a and 414c are connected to the sources of both n-channel MOSFETs 414b and 414d. Drains of p-channel MOSFETs 413b and 413d are connected to drains of n-channel MOSFETs 414b and 414d and all these drains are connected to output 412. The p-channel and n-channel MOSFETs of FIG. 4 behave in the same manner described above in relation to p-channel MOSFET 313a and n-channel MOSFET 314a of FIG. 3.

The operation of voting circuit 420 will be now described in reference to several examples. There are four paths by which output 412 can connect to voltage $V_{DD}$ and four paths by which output 412 can connect to voltage $V_{SS}$. Each path travels through two MOSFETs. For example, the four paths from $V_{DD}$ to output 412 are the 413a-413b path, the 413a-413d path, the 413c-413b path, and the 413c-413d path. The four paths from $V_{SS}$ to output 412 are the 414a-414b path, the 414a-414d path, the 414c-414b path, and the 414c-414d path. Output 412 is only connected to $V_{DD}$ or $V_{SS}$ by a particular path if both MOSFETs in the path are "on."

In a first example, all of inputs 411a-411d are high. If all of inputs 411a-411d are high, then all of p-channel MOSFETs 413a-413d are "off," and all of n-channel MOSFETs 414a-414d are "on." If all of p-channel MOSFETs 413a-413d are "off" and all of n-channel MOSFETs 414a-411d are "on," then output 412 is not connected to high voltage $V_{DD}$ through any available current path and is connected to low voltage $V_{SS}$ through all available current paths. In such a scenario, output 412 will be driven to the low voltage $V_{SS}$.

In a second example, all of inputs 411a-411d are low. If all of inputs 411a-411d are low, then all of p-channel MOSFETs 413a-413d are "on," and all of n-channel MOSFETs 414a-414d are "off." If all of p-channel MOSFETs 413a-413d are "on" and all of n-channel MOSFETs 414a-414d are "off," then output 412 is connected to high voltage $V_{DD}$ through all available current paths and is not connected to low voltage $V_{SS}$ through any available current paths. In such a scenario, output 412 will be driven to the high voltage $V_{DD}$.

In a third example, inputs 411a, 411b, and 411c are high while input 411d is low. If inputs 411a, 411b, and 411c are high, then p-channel MOSFETs 413a, 413b, and 413c are "off" while n-channel MOSFETs 414a, 414b, and 414c are "on." If input 411d is low, then p-channel MOSFET 413d is "on" while n-channel MOSFETs 414d is "off." Thus, output 412 is not connected to $V_{DD}$ through any path because none of the four paths connecting $V_{DD}$ to output 412 have both MOSFETs "on." Output 412, however, is connected to $V_{SS}$ through two paths (414a-414b, and 414c-414b), which drives output 412 low to $V_{SS}$.

In a fourth example, inputs 411a, 411b, and 411c are low while input 411d is high. If inputs 411a, 411b, and 411c are low, then p-channel MOSFETs 413a, 413b, and 413c are "on" while n-channel MOSFETs 414a, 414b, and 414c are "off." If input 411d is high, then p-channel MOSFET 413d is "off" while n-channel MOSFETs 414d is "on." Thus, output 412 is not connected to $V_{SS}$ through any path because none of the four paths connecting $V_{SS}$ to output 412 have both MOSFETs "on." Output 412, however, is connected to $V_{DD}$ through two paths (413a-413b and 413c-413b), which drives output 412 high to $V_{DD}$.

Other examples, such as inputs 411a, 411c, and 411d being high while input 411b is low or inputs 411a, 411c, and 411d being low while input 411b is high, may cause voting circuit 420 to behave in an analogous manner to the third and fourth examples set forth above, although the particular paths connecting output 412 to $V_{DD}$ and $V_{SS}$ may differ.

The disturbed drive strength of the voting circuit of FIG. 4 can be affected by the selection of p-channel MOSFET sizes and n-channel MOSFET sizes. For example, if the gate widths of all of p-channel MOSFETs 413a-413d are relatively equal to one another, and the gate widths of n-channel MOSFETs 414a-414d are relatively equal to one another, then the disturbed drive strength may be approximately sixty-seven percent of the full drive. Using unequal gate widths can result in some combinations of N–1 inputs agreeing producing a disturbed drive strength ratio greater than approximately sixty-seven percent but there may also be some combinations of N–1 inputs agreeing that produce a disturbed drive strength ratio less than approximately sixty-seven percent. In general, however, the gate widths relatively equal to one another described above that results in a disturbed drive strength of about sixty-seven percent may generally be an optimal configuration for most applications.

Figure 5:
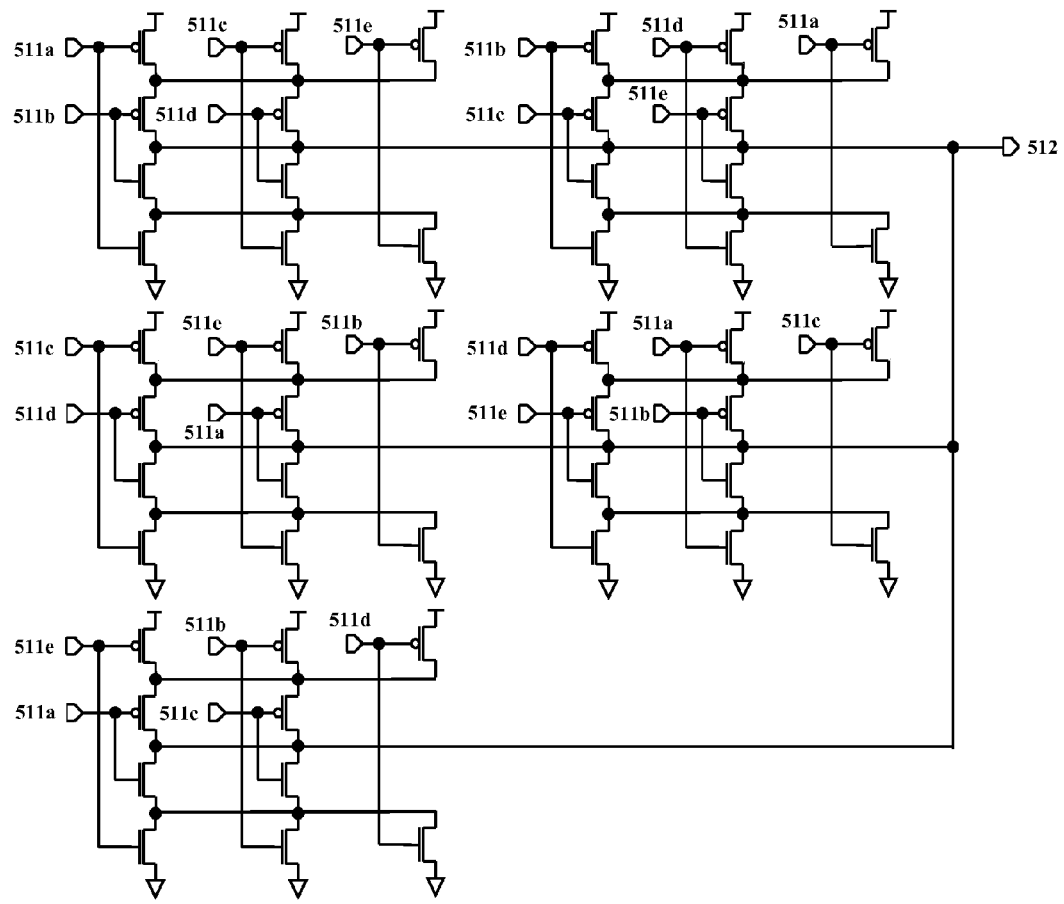
FIG. 5 shows a circuit diagram for a 4-out-of-5 voting circuit according to techniques of this disclosure.
Figure 6:
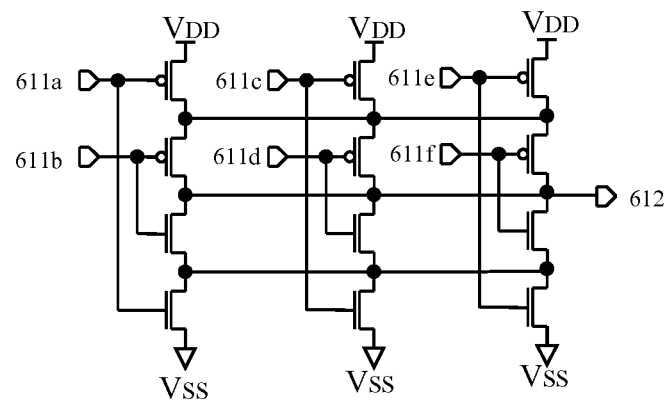
FIG. 6 shows a circuit diagram for a 5-out-of-6 voting circuit according to techniques of this disclosure.

FIG. 5 shows an example of a 4-out-of-5 voting circuit 510 that receives five inputs 511a-e and produces an output 512 based on the five inputs 511a-511e. Voting circuit 510 includes a plurality of p-channel MOSFETs and a plurality of n-channel MOSFETs arranged in the configuration shown in FIG. 5. FIG. 6 shows an example of a 5-out-of-6 voting circuit 620 that receives six inputs 611a-611f and produces an output 612 based on the six inputs 611a-611f. Voting circuit 620 includes a plurality of p-channel MOSFETs and a plurality of n-channel MOSFETs arranged in the configuration shown in FIG. 6. The circuits of FIGS. 5 and 6 operate according to the same principles described above in relation to FIGS. 3 and 4. Outputs 512 and 612 are connected by a plurality of paths to a high voltage ($V_{DD}$) and by a plurality of paths to a low voltage ($V_{SS}$). In response to four out of-five or five out of six inputs (generically N–1 out-of N) agreeing, there will either be paths that connects the output to $V_{DD}$ or paths that connects the output to $V_{SS}$.

An (N–1)-out-of-N voting circuit is comprised of an arrangement of p-channel MOSFETs between $V_{DD}$ and the output and an arrangement of n-channel MOSFETs between $V_{SS}$ and the output. The p-channel MOSFETs are arranged such that for any combination where N or N–1 inputs are high and zero or one input is low, there are no conducting paths between $V_{DD}$ and the output. The n-channel MOSFETs are also arranged such that for any combination of N or N–1 inputs that are high and zero or one input is low, there are conducting paths between $V_{SS}$ and the output. Therefore, when N or N–1 inputs are high, the output of an (N–1)-out-of-N voting circuit will be low (i.e. $V_{SS}$).

The p-channel MOSFETs are arranged such that for any combination where N or N–1 inputs are low and zero or one input is high, there are conducting paths between $V_{DD}$ and the output. The n-channel MOSFETs are also arranged such that for any combination of N or N–1 inputs that are low and zero or one input is high, there is not a conducting path between $V_{SS}$ and the output. Therefore, when N or N–1 inputs are low, the output of an (N–1)-out-of-N voting circuit will be high (i.e. $V_{DD}$).

Figure 7:
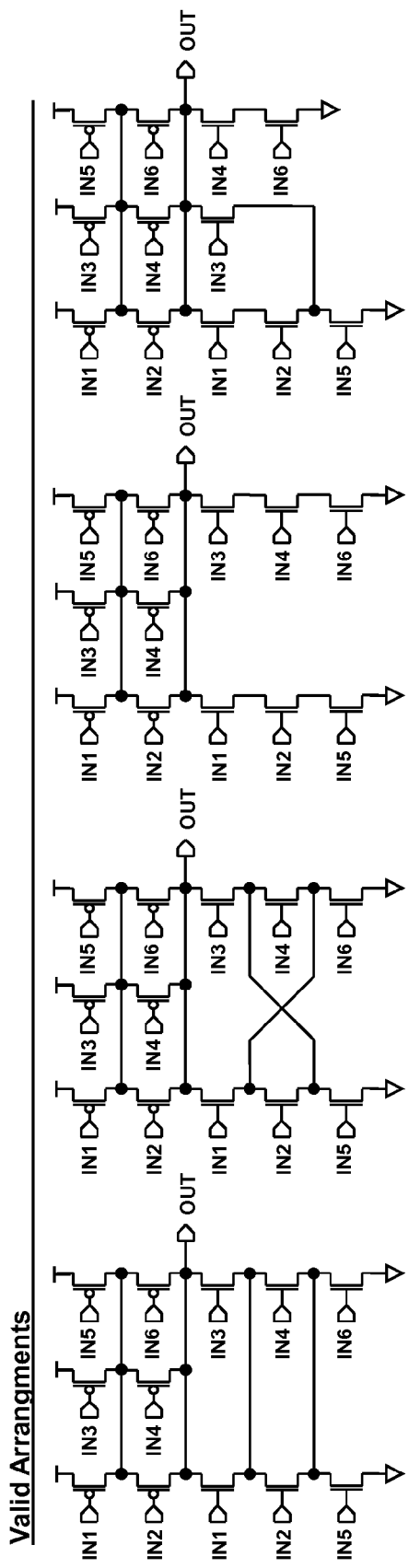
FIG. 7 shows circuit diagrams for portions of an (N−1)-out-of-N voting circuit, where N is even.

The voting circuits of FIGS. 4 and 6 show the progression of expansion from four inputs to six inputs. This progression can be extended to N inputs where N is an even number and will henceforth be referred to as the N is even progression. For N inputs there are N p-channel MOSFETs and N n-channel MOSFETs where each input connects to the gate of one p-channel MOSFET and the gate of one n-channel MOSFET. Between $V_{DD}$ and the output, the p-channel MOSFETs can be arranged in any combination of parallel and series configurations as long as each path from $V_{DD}$ to the output has at least two MOSFETs in series and no single MOSFET has all paths passing through it. Further, the source/drain node connections between the series p-channel MOSFETs may or may not be connected together. Between $V_{SS}$ and the output, the n-channel MOSFETs can be arranged in any combination of parallel and series configurations as long as each path from $V_{SS}$ to the output has at least two MOSFETs in series and no single MOSFET has all paths passing through it. Further, the source/drain node connections between the series n-channel MOSFETs may or may not be connected together. Further, connecting the source/drain connections together can be done in any combination as long as the source/drain connection does not create a direct bypass around one or more MOSFETs connected in series. Further, the p-channel and n-channel MOSFET arrangements need not be the same. For example, FIG. 6 has the p-channel MOSFETs between $V_{DD}$ and the output arranged as three stacks with two MOSFETs in each stack (e.g., the p-channel MOSFETs with gates connected to 611a and 611b are a two MOSFET stack) and the source/drain node connections in each stack are all connected together. This could also be arranged as two stacks with three MOSFETs in each stack and the resulting four source/drain nodes could be horizontally connected, cross connected or not connected together. Examples of valid source/drain connection arrangements are shown in FIG. 7, where IN1 through IN6 are inputs of the voting circuits and OUT is the output.

The MOSFET arrangement that results in the maximum disturbed drive strength ratio that is also the same for any one input that disagrees with the other inputs may also have the following additional features. There are just two MOSFETs in series for any path between $V_{DD}$ and the output and $V_{SS}$ and the output (i.e., N/2 stacks with two MOSFETs in each stack) and the p-channel MOSFET source/drain node connections in each path are all connected together and the n-channel MOSFET source/drain node connections in each path are all connected together.

The voting circuits of FIGS. 3 and 5 show the progression of expansion from three inputs to five inputs. This progression can be extended to N inputs where N is an odd number and will henceforth be referred to as the N is odd progression. For N inputs there are N groups (e.g., In FIG. 3 MOSFETs 313a-313c plus 314a-314c are a group). The number of groups need not be equal to N but this may result in disturbed drive strength ratios that are not the same for any one input that disagrees with the other inputs. Within each group there are N p-channel MOSFETs and N n-channel MOSFETs where each input connects to the gate of one p-channel MOSFET and the gate of one n-channel MOSFET. Between $V_{DD}$ and the output within a group, the p-channel MOSFETs can be arranged in any combination of parallel and series configurations as long as each path from $V_{DD}$ to the output has at least two MOSFETs in series. Further, the source/drain node connections between the series p-channel MOSFETs may or may not be connected together. Between $V_{SS}$ and the output within a group, the n-channel MOSFETs can be arranged in any combination of parallel and series configurations as long as each path from $V_{SS}$ to the output has at least two MOSFETs in series. Further, the source/drain node connections between the series n-channel MOSFETs may or may not be connected together. Further, connecting the source/drain connections together can be done in any combination as long as the source/drain connection does not create a direct bypass around one or more MOSFETs connected in series. Further, each MOSFET location where there is only one MOSFET between the source and drain nodes (e.g., in FIG. 3 313a and 313c are two MOSFETs between the source and drain nodes but 313b is one MOSFET between the source and drain nodes) can connect to a different input between at least two groups. In other words, the same input does not connect to the single MOSFET between source and drain nodes in all groups. Further, the p-channel and n-channel MOSFET arrangements need not be the same. Further, the only common connections between groups are the N inputs, $V_{DD}$, $V_{SS}$ and the output.

Figure 8:
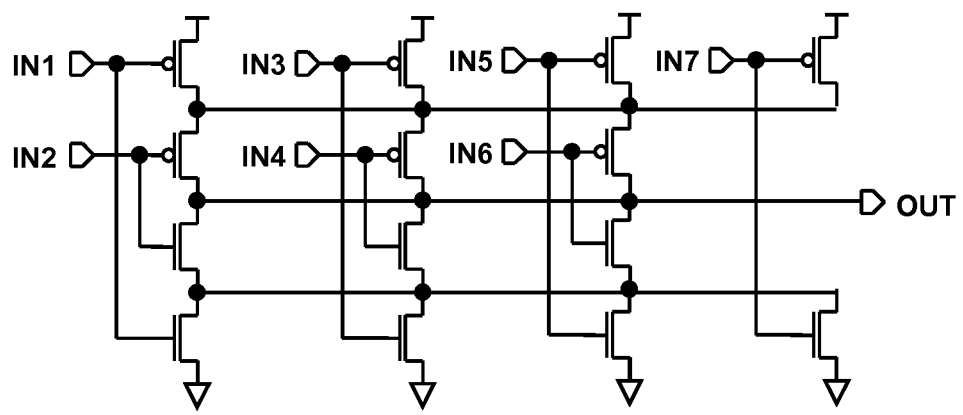
FIG. 8 shows a circuit diagram for a portion of an (N−1)-out-of-N voting circuit, where N is odd.

The N is even progression may also work when N is an odd number as shown in FIG. 8, but the disturbed drive strength ratio may vary depending on which one of the inputs (IN1 . . . IN7) disagrees with the other inputs. The MOSFET arrangement when N is an odd number that results in a disturbed drive strength ratio that is the same for any one input that disagrees with the other inputs is created by the N is odd progression. The MOSFET arrangement that results in the maximum disturbed drive strength ratio that is also the same for any one input that disagrees with the other inputs may have the following additional features. The MOSFET arrangement is the same within each group and there are just two MOSFETs in series for any path between $V_{DD}$ and the output and $V_{SS}$ and the output and the p-channel MOSFET source/drain node connections in each path are all connected together and the n-channel MOSFET source/drain node connections in each path are all connected together. Further, each input must connect to K groups within each MOSFET source/drain parallel connected level of the MOSFET stack where K is the number of MOSFETs within that level within a group (e.g., In FIG. 3 MOSFETs 313a and 313c are one level of the MOSFET stack where these MOSFETs source/drain nodes are connected in parallel and thus K=2. MOSFET 313b is another level of the MOSFET stack where there is only one MOSFET and thus K=1). Thus, FIGS. 3 and 5 show the preferred arrangement to maximize the disturbed drive strength ratio when N is an odd number.

Although not shown explicitly in the figures described above, p-channel bodies of the p-channel MOSFET can be connected to the high voltage ($V_{DD}$), or the p-channel body for a particular p-channel MOSFET can be connected to the source of that particular p-channel MOSFET, such that the voltage at the body equals the voltage at the source. Similarly, n-channel bodies of the n-channel MOSFETs can be connected to the low voltage ($V_{SS}$), or the n-channel body for a particular n-channel MOSFET can be connected to the source of that particular n-channel MOSFET, such that the voltage at the body equals the voltage at the source.

Various embodiments of the invention have been described. These and other embodiments are within the scope of the following claims.

The invention claimed is:

1. A circuit comprising:
a plurality of inputs;
an output;
a high voltage source;
a low voltage source;
a first plurality of logic paths connecting the output to the high voltage, wherein each logic path of the first plurality of logic paths comprises two transistors, wherein in response to a majority but not all of the plurality of inputs having a same value, two or more logic paths of the first plurality of logic paths enable current flow between the high voltage source and the output;
a second plurality of logic paths connecting the output to the low voltage, wherein each logic path of the second plurality of logic paths comprises two transistors, wherein a first logic path of the second plurality of logic paths comprises a first re-channel MOSFET and a second n-channel MOSFET, and wherein a second logic path of the second plurality of logic paths comprises the second n-channel MOSFET and a third n-channel MOSFET, and wherein
a source of the first n-channel MOSFET is connected to the low voltage source and a source of the third n-channel is connected to the low voltage source;
a drain of the first n-channel MOSFET is connected to a source of the second n-channel MOSFET and a drain of the third n-channel MOSFET is connected to the source of the second n-channel MOSFET; and,
a drain of the second n-channel MOSFET is connected to the output.

2. The circuit of claim 1, wherein the two transistors of each logic path of the first plurality of logic paths are p-channel metal-oxide semiconductor field-effect transistors (MOSFETs).

3. The circuit of claim 2, wherein each path comprises a first p-channel MOSFET connected to the high voltage source and a second p-channel MOSFET connected between the first p-channel and the output.

4. The circuit of claim 3, wherein the first p-channel MOSFET has a larger gate width than the second p-channel MOSFET.

5. The circuit of claim 1, wherein the first n-channel MOSFET has a larger gate width than the second n-channel MOSFET.

6. The circuit of claim 1,
wherein each input is connected to a gate of a MOSFET from the first plurality of MOSFETs and a gate of a MOSFET from the second plurality of MOSFETs;
wherein each MOSFET of the first plurality of MOSFETs is configured to allow current from a source of the MOSFET of the first plurality to a drain of the MOSFET of the plurality in response to a low voltage being applied to the gate of the MOSFET of the first plurality and to inhibit current flow from the drain of the MOSFET of the first plurality to the source of the MOSFET of the first plurality in response to a high voltage being applied to the gate of the MOSFET of the plurality;

wherein each MOSFET of the second plurality of MOSFETs is configured to inhibit current from a source of the MOSFET of the second plurality to a drain of the MOSFET of the second plurality in response to a low voltage being applied to the gate of the MOSFET of the second plurality and to allow current flow from the drain of the MOSFET of the second plurality to the source of MOSFET of the second plurality in response to a high voltage being applied to the gate of the MOSFET of the second plurality.

7. The circuit of claim 1, wherein the first plurality of MOSFETs inhibits current flow through all paths of the first plurality of paths when one input of the plurality of inputs is low and the other inputs of the plurality of inputs are high.

8. The circuit of claim 1, wherein the second plurality of MOSFETs inhibits current flow through all paths of the second plurality of paths when one input of the plurality of inputs is high and the other inputs of the plurality of inputs are low.

9. The circuit of claim 1, wherein the first plurality of MOSFETs enables current flow through a subset of the first plurality of paths when one input of the plurality of inputs is high and the other inputs of the plurality of inputs are low.

10. The circuit of claim 1, wherein the second plurality of MOSFETs enables current flow through a subset of the second plurality of paths when one input of the plurality of inputs is low and the other inputs of the plurality of inputs are high.

11. The circuit of claim 1, wherein the circuit is a 2-out-of-3 voting circuit.

12. The circuit of claim 1, wherein the circuit is a 3-out-of-4 voting circuit.

13. The circuit of claim 1, wherein the circuit is an (N−1)-out-of-N voting circuit.

14. A 2-out-of-3 voting circuit comprising:
a first input;
a second input;
a third input;
a high voltage source;
a low voltage source;
a first p-channel metal-oxide silicon field-effect transistor (MOSFET), wherein a source of the first p-channel MOSFET is connected to the high voltage source and a gate of the first p-channel MOSFET is connected to the first input;
a second p-channel MOSFET, wherein a source of the second p-channel MOSFET is connected to the high voltage source and a gate of the second p-channel MOSFET is connected to the third input;
a third p-channel MOSFET, wherein a source of the third p-channel MOSFET is connected to the high voltage source and a gate of the third p-channel MOSFET is connected to the second input;
a fourth p-channel MOSFET, wherein a source of the fourth p-channel MOSFET is connected to the high voltage source and a gate of the fourth p-channel MOSFET is connected to the first input;
a fifth p-channel MOSFET, wherein a source of the fifth p-channel MOSFET is connected to the high voltage source and a gate of the fifth p-channel MOSFET is connected to the third input;
a sixth p-channel MOSFET, wherein a source of the sixth p-channel MOSFET is connected to the high voltage source and a gate of the sixth p-channel MOSFET is connected to the second input;
a first n-channel MOSFET, wherein a source of the first n-channel MOSFET is connected to the low voltage source and a gate of the first n-channel MOSFET is connected to the first input;
a second n-channel MOSFET, wherein a source of the second n-channel MOSFET is connected to the low voltage source and a gate of the second n-channel MOSFET is connected to the third input;
a third n-channel MOSFET, wherein a source of the third n-channel MOSFET is connected to the low voltage source and a gate of the third n-channel MOSFET is connected to the second input;
a fourth n-channel MOSFET, wherein a source of the fourth n-channel MOSFET is connected to the low voltage source and a gate of the fourth n-channel MOSFET is connected to the first input;
a fifth n-channel MOSFET, wherein a source of the fifth n-channel MOSFET is connected to the low voltage source and a gate of the fifth n-channel MOSFET is connected to the third input;
a sixth n-channel MOSFET, wherein a source of the sixth n-channel MOSFET is connected to the low voltage source and a gate of the sixth n-channel MOSFET is connected to the second input;
a seventh p-channel MOSFET, wherein a source of the seventh p-channel MOSFET is connected to a drain of the first p-channel MOSFET and a drain of the second p-channel MOSFET and a gate of the seventh p-channel MOSFET is connected to the second input;
an eighth p-channel MOSFET, wherein a source of the eighth p-channel MOSFET is connected to a drain of the third p-channel MOSFET and a drain of the fourth p-channel MOSFET, and a gate of the eighth p-channel MOSFET is connected to the third input;
a ninth p-channel MOSFET, wherein a source of the ninth p-channel MOSFET is connected to a drain of the fifth p-channel MOSFET and a drain of the sixth p-channel MOSFET, and a gate of the ninth p-channel MOSFET is connected to the first input;
a seventh n-channel MOSFET, wherein a source of the seventh n-channel MOSFET is connected to a drain of the first n-channel MOSFET and a drain of the second n-channel MOSFET, and a gate of the seventh n-channel MOSFET is connected to the second input;
an eighth n-channel MOSFET, wherein a source of the eighth n-channel MOSFET is connected to a drain of the third n-channel MOSFET and a drain of the fourth n-channel MOSFET, and a gate of the eighth n-channel MOSFET is connected to the third input;
a ninth n-channel MOSFET, wherein a source of the ninth n-channel MOSFET is connected to a drain of the fifth n-channel MOSFET and a drain of the sixth n-channel MOSFET, and a gate of the ninth n-channel MOSFET is connected to the first input;
an output, wherein the output is connected to a drain of the seventh n-channel MOSFET, a drain of the eighth n-channel MOSFET, a drain of the ninth n-channel MOSFET, a drain of the seventh p-channel MOSFET, a drain of the eighth p-channel MOSFET, and a drain of the ninth p-channel MOSFET.

15. A 3-out-of-4 voting circuit comprising:
a first input;
a second input;
a third input;
a fourth input;
a high voltage source;
a low voltage source;
a first p-channel metal-oxide silicon field-effect transistor (MOSFET), wherein a source of the first p-channel MOSFET is connected to the high voltage source and a gate of the first p-channel MOSFET is connected to the first input;

a second p-channel MOSFET, wherein a source of the second p-channel MOSFET is connected to the high voltage source and a gate of the second p-channel MOSFET is connected to the second input;

a third p-channel MOSFET, wherein a source of the third p-channel MOSFET is connected to a drain of the first p-channel MOSFET and a drain of the second p-channel MOSFET, and a gate of the third p-channel MOSFET is connected to the third input;

a fourth p-channel MOSFET, wherein a source of the fourth p-channel MOSFET is connected to a drain of the first p-channel MOSFET and a drain of the second p-channel MOSFET, and a gate of the fourth p-channel MOSFET is connected to the fourth input;

a first n-channel MOSFET, wherein a source of the first n-channel MOSFET is connected to the low voltage source and a gate of the first n-channel MOSFET is connected to the first input;

a second n-channel MOSFET, wherein a source of the second n-channel MOSFET is connected to the low voltage source and a gate of the second n-channel MOSFET is connected to the second input;

a third n-channel MOSFET, wherein a source of the third n-channel MOSFET is connected to a drain of the first n-channel MOSFET and a drain of the second n-channel MOSFET, and a gate of the third n-channel MOSFET is connected to the third input;

a fourth n-channel MOSFET, wherein a source of the fourth n-channel MOSFET is connected to a drain of the first n-channel MOSFET and a drain of the second n-channel MOSFET, and a gate of the fourth n-channel MOSFET is connected to the fourth input;

an output, wherein the output is connected to a drain of the third n-channel MOSFET, a drain of the fourth n-channel MOSFET, a drain of the third p-channel MOSFET, a drain of the fourth p-channel MOSFET.

* * * * *